(12) United States Patent
Lin et al.

(10) Patent No.: US 11,854,882 B2
(45) Date of Patent: Dec. 26, 2023

(54) SUBTRACTIVE PLUG AND TAB PATTERNING WITH PHOTOBUCKETS FOR BACK END OF LINE (BEOL) SPACER-BASED INTERCONNECTS

(71) Applicant: Tahoe Research, Ltd., Dublin (IE)

(72) Inventors: Kevin Lin, Beaverton, OR (US); Robert L. Bristol, Portland, OR (US); Richard E. Schenker, Portland, OR (US)

(73) Assignee: Tahoe Research, Ltd., Dublin (IE)

( * ) Notice: Subject to any disclaimer, the term of this patent is extended or adjusted under 35 U.S.C. 154(b) by 539 days.

(21) Appl. No.: 17/085,882

(22) Filed: Oct. 30, 2020

(65) Prior Publication Data
US 2021/0050261 A1 Feb. 18, 2021

Related U.S. Application Data

(62) Division of application No. 16/093,076, filed as application No. PCT/US2016/034624 on May 27, 2016, now Pat. No. 10,867,853.

(51) Int. Cl.
*H01L 21/768* (2006.01)
*H01L 23/522* (2006.01)
*H01L 23/528* (2006.01)

(52) U.S. Cl.
CPC .. *H01L 21/76897* (2013.01); *H01L 21/76816* (2013.01); *H01L 21/76832* (2013.01); *H01L 21/76837* (2013.01); *H01L 21/76885* (2013.01); *H01L 23/528* (2013.01); *H01L 23/5226* (2013.01); *H01L 21/7682* (2013.01)

(58) Field of Classification Search
CPC ......... H01L 21/76897; H01L 21/76816; H01L 21/76832; H01L 21/76837; H01L 21/76885; H01L 23/5226; H01L 23/528; H01L 21/7682
See application file for complete search history.

(56) References Cited

U.S. PATENT DOCUMENTS 5,189,506 A 2/1993 Cronin
6,030,896 A 2/2000 Brown
(Continued)

OTHER PUBLICATIONS

Notice of Allowance from Taiwan Patent Application No. 106113320, dated Mar. 3, 2021, 3 pgs.
(Continued)

*Primary Examiner* — Karen Kusumakar
(74) *Attorney, Agent, or Firm* — Studebaker & Brackett PC

(57) ABSTRACT

Subtractive plug and tab patterning with photobuckets for back end of line (BEOL) spacer-based interconnects is described. In an example, a back end of line (BEOL) metallization layer for a semiconductor structure includes an inter-layer dielectric (ILD) layer disposed above a substrate. A plurality of conductive lines is disposed in the ILD layer along a first direction. A conductive tab is disposed in the ILD layer, the conductive tab coupling two of the plurality of conductive lines along a second direction orthogonal to the first direction. A conductive via is coupled to one of the plurality of conductive lines, the conductive via having a via hardmask thereon. An uppermost surface of each of the ILD layer, the plurality of conductive lines, the conductive tab, and the via hardmask is planar with one another.

25 Claims, 14 Drawing Sheets

(56) References Cited

U.S. PATENT DOCUMENTS

| | | | |
|---|---|---|---|
| 6,103,629 | A | 8/2000 | Kitch |
| 6,852,620 | B2 | 2/2005 | Kim |
| 7,939,910 | B2 | 5/2011 | Cho |
| 8,614,144 | B2 | 12/2013 | Kato |
| 8,946,077 | B2 | 2/2015 | Lee |
| 9,041,217 | B1 | 5/2015 | Bristol et al. |
| 9,209,077 | B2 | 12/2015 | Myers |
| 9,236,342 | B2 | 1/2016 | Bristol et al. |
| 9,406,512 | B2 | 8/2016 | Bristol et al. |
| 9,548,269 | B2 | 1/2017 | Myers |
| 9,666,451 | B2 | 5/2017 | Wallace |
| 9,793,159 | B2 | 10/2017 | Wallace |
| 9,793,163 | B2 | 10/2017 | Bristol et al. |
| 10,014,256 | B2 | 7/2018 | Nelson |
| 10,211,088 | B2 | 2/2019 | Wallace |
| 10,269,623 | B2 | 4/2019 | Bristol et al. |
| 10,319,625 | B2 | 6/2019 | Nyhus |
| 10,395,883 | B2 | 8/2019 | Tandon |
| 10,522,402 | B2 | 12/2019 | Guler |
| 10,559,529 | B2 | 2/2020 | Wallace |
| 2003/0073251 | A1 | 4/2003 | Ning |
| 2004/0016964 | A1 | 1/2004 | Kim et al. |
| 2009/0200683 | A1 | 8/2009 | Colbum |
| 2011/0185330 | A1* | 7/2011 | Collins ............... H01L 23/528 716/130 |
| 2015/0171010 | A1 | 6/2015 | Bristol et al. |
| 2015/0179513 | A1 | 6/2015 | Myers et al. |
| 2015/0243599 | A1 | 8/2015 | Jezewski et al. |
| 2015/0255284 | A1 | 9/2015 | Bristol et al. |
| 2015/0303107 | A1 | 10/2015 | Eom |
| 2017/0263496 | A1 | 9/2017 | Hourani |
| 2018/0102282 | A1 | 4/2018 | Krysak |
| 2018/0158694 | A1 | 6/2018 | Lin |
| 2018/0308754 | A1 | 10/2018 | Guler |
| 2018/0315590 | A1 | 11/2018 | Schenker |
| 2018/0323100 | A1 | 11/2018 | Nyhus |
| 2018/0323104 | A1 | 11/2018 | Younkin |
| 2019/0013246 | A1 | 1/2019 | Wallace |
| 2019/0025694 | A1 | 1/2019 | Choi |
| 2019/0043731 | A1 | 2/2019 | Bristol et al. |
| 2019/0206733 | A1* | 7/2019 | Lin ............... H01L 21/76832 |
| 2019/0252208 | A1 | 8/2019 | Wallace |

OTHER PUBLICATIONS

Office Action from Taiwan Patent Application No. 106113320, dated Aug. 19, 2020, 9 pgs., with English translation.

International Search Report and Written Opinion for International Patent Application No. PCT/US2016/034624 dated, 2016, 11 pgs.

International Preliminary Report on Patentability for International Patent Application No. PCT/US2016/034624 dated Dec. 6, 2018, 8 pgs.

* cited by examiner

US 11,854,882 B2

SUBTRACTIVE PLUG AND TAB PATTERNING WITH PHOTOBUCKETS FOR BACK END OF LINE (BEOL) SPACER-BASED INTERCONNECTS

CROSS-REFERENCE TO RELATED APPLICATION

This patent application is a divisional of U.S. patent application Ser. No. 16/093,076, filed Oct. 11, 2018, which is a U.S. National Phase Application under 35 U.S.C. § 371 of International Application No. PCT/US2016/034624, filed May 27, 2016, entitled "SUBTRACTIVE PLUG AND TAB PATTERNING WITH PHOTOBUCKETS FOR BACK END OF LINE (BEOL) SPACER-BASED INTERCONNECTS," which designates the United States of America, the entire disclosure of which are hereby incorporated by reference in their entirety and for all purposes.

TECHNICAL FIELD

Embodiments of the invention are in the field of semiconductor structures and processing and, in particular, subtractive plug and tab patterning with photobuckets for back end of line (BEOL) spacer-based interconnects.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70-90 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly several different lithographic masks may be used, which tend to increase the costs. At some point, if pitches continue to decrease, it may not be possible, even with multiple masks, to print via openings for these extremely small pitches using EUV scanners. The above factors are also relevant for considering placement and scaling of dielectric plugs or metal line ends among the metal lines of back end of line (BEOL) metal interconnect structures.

Thus, improvements are needed in the area of back end metallization manufacturing technologies for fabricating metal lines, metal vias, and dielectric plugs.

DESCRIPTION OF THE EMBODIMENTS

Subtractive plug and tab patterning with photobuckets for back end of line (BEOL) spacer-based interconnects is described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to photobucket approaches for subtractive plug and tab patterning. Such patterning schemes may be implemented to enable bi-directional spacer-based interconnects. Implementations may be particularly suitable for electrically connecting two parallel lines of a metallization layer where the two metal lines were fabricated using a spacer-based approach which otherwise may restrict the inclusion of conductive connection between two adjacent lines in a same metallization layer.

In general, one or more embodiments are directed to an approach that employs a subtractive technique to form conductive tabs and non-conductive spaces or interruptions between metals (referred to as "plugs"). Conductive tabs, by definition, are conductive linkers between two conductive metal lines, such as between two parallel conductive lines. The tabs are typically in a same layer as the metal lines. The processing schemes may also be suitable for conductive via fabrication. Vias, by definition, are used to land on a previous layer metal pattern.

More specifically, one or more embodiment described herein involves the use of a subtractive method to form tabs and plugs. To provide context, state of the art solutions for subtractive interconnect patterning may have associated disadvantages. For example, there may be no self-alignment between cuts and vias. Also, due to spacer-based patterning, tight-pitched interconnects only run in one direction. As such, in order to connect two adjacent interconnects, a metal line is implemented above or below the layer requiring interconnection.

Figure 1A:
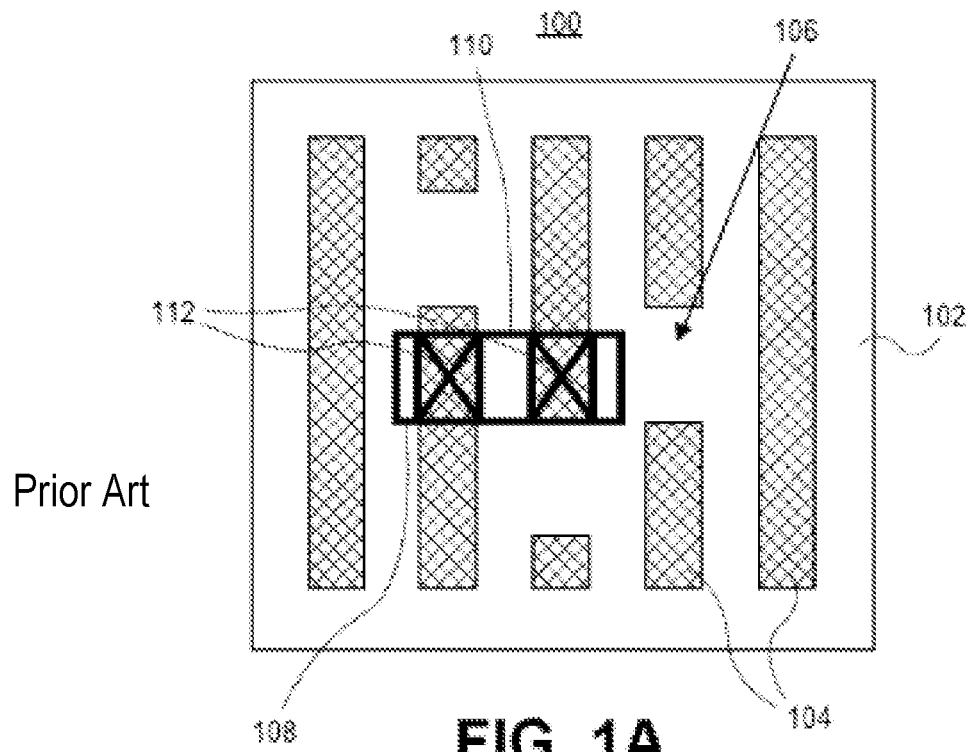
FIG. 1A illustrates a plan view of a conventional back end of line (BEOL) metallization layer patterned using spacer-based pitch division.

By way of example, FIG. 1A illustrates a plan view of a conventional back end of line (BEOL) metallization layer. Referring to FIG. 1A, a conventional BEOL metallization layer 100 is shown with conductive lines or routing 104 disposed in an inter-layer dielectric layer 102. The metal lines may generally run parallel to one another and may include cuts, breaks or plugs 106 in the continuity of one or more of the conductive lines 104. In order to electrically couple two or more of the parallel metal lines, upper or lower layer routing 108 is included in a previous or next metallization layer. Such upper or lower layer routing 108 may include a conductive line 110 coupling conductive vias 112. It is to be appreciated that, since the upper or lower layer routing 108 is included in a previous or next metallization layer, the upper or lower layer routing 108 can consume vertical real estate of a semiconductor structure that includes the metallization layers.

Figure 1B:
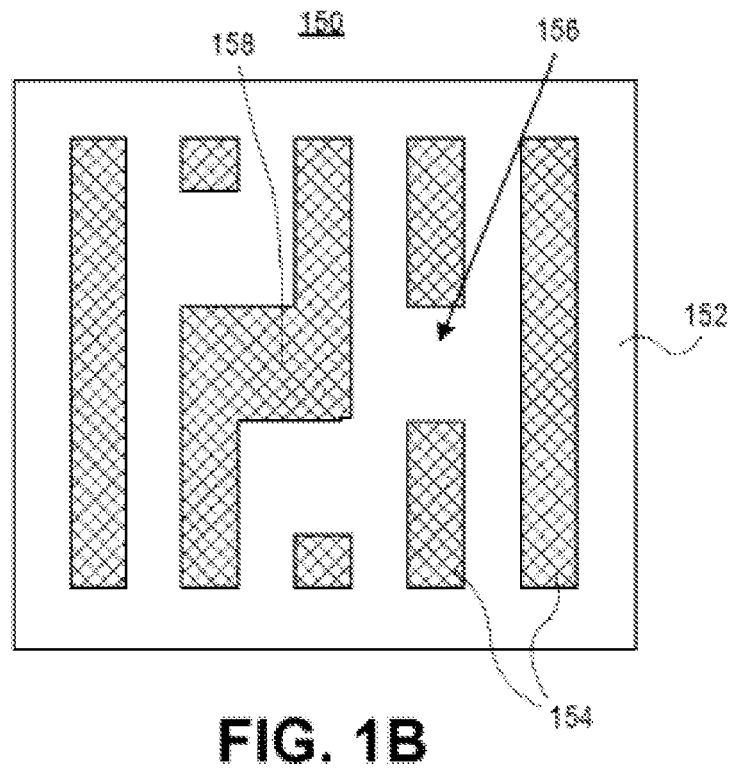
FIG. 1B illustrates a plan view of a back end of line (BEOL) metallization layer having a conductive tab coupling metal lines of the metallization layer, in accordance with an embodiment of the present invention.

By contrast, FIG. 1B illustrates a plan view of a back end of line (BEOL) metallization layer having a conductive tab coupling metal lines of the metallization layer, in accordance with an embodiment of the present invention. Referring to FIG. 1B, a BEOL metallization layer 150 is shown with conductive lines or routing 154 disposed in an inter-layer dielectric layer 152. The metal lines may generally run parallel to one another and may include cuts, breaks or plugs 156 in the continuity of one or more of the conductive lines 154. In order to electrically couple two or more of the parallel metal lines, a conductive tab 158 is included in the metallization layer 150. It is to be appreciated that, since the conductive tab 158 is included in the same metallization layer as the conductive lines 154, the conductive tab 158 consumption of vertical real estate of a semiconductor structure that includes the metallization layer can be reduced relative to the structure of FIG. 1A.

One or more embodiments described herein provide an approach for subtractively patterning vias, cuts, and/or tabs with self-alignment using a photobucketing approach and selective hard masks. Embodiments may involve use of a so-called textile patterning approach for subtractively-patterned self-aligned interconnects, plugs, and vias. A textile approach may involve implementation of a textile pattern of hardmasks with etch selectivity among each hardmask material. In specific embodiments described herein, a textile processing scheme is implemented to pattern interconnects, cuts, and vias subtractively.

As an overview of one or more embodiments described herein, a general overview process flow can involve the following process sequence: (1) fabrication using a textile process flow with four "color" hardmasks that are etch selective to one another, (2) removing a first of the hardmask types for photobucketing for vias, (3) backfilling the first hardmask material, (4) removing a second of the hardmask types for photobucketing for cuts (or plugs), (5) backfilling the second mask material, (6) removing a third of the hardmask types for photobucketing for conductive tabs, (7) subtractively etching metal for cuts and tabs, and (8) hardmask removal and subsequent backfilling with permanent ILD material and polish back.

Figure 2:
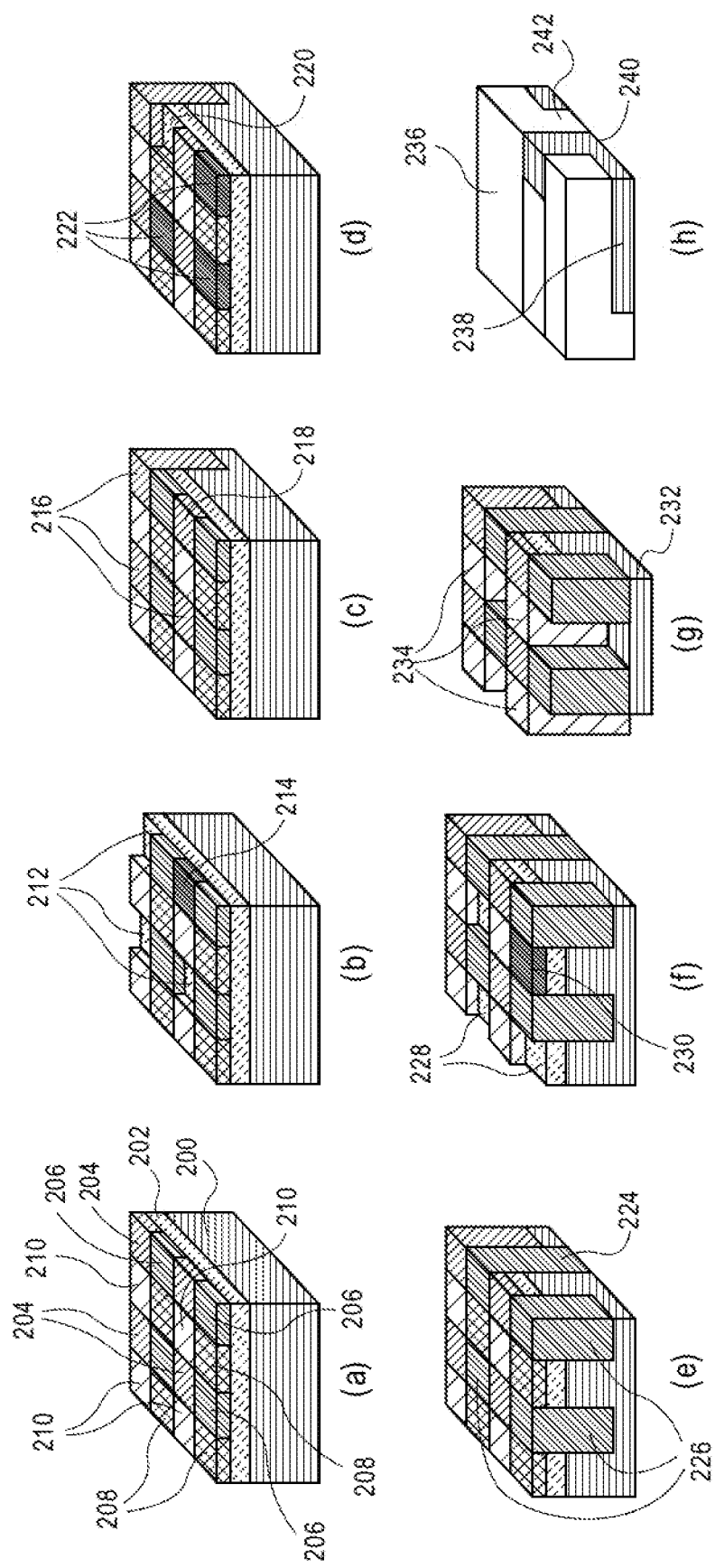
FIG. 2 illustrates angled cross-sectional views representing various operations in a method of fabricating a back end of line (BEOL) metallization layer having a conductive tab coupling metal lines of the metallization layer, in accordance with an embodiment of the present invention.

Providing a general processing scheme, FIG. 2 illustrates angled cross-sectional views representing various operations in a method of fabricating a back end of line (BEOL) metallization layer having a conductive tab coupling metal lines of the metallization layer, in accordance with an embodiment of the present invention.

Referring to part (a) of FIG. 2, the process begins at a textile starting structure. The textile starting structure includes a blanket hardmask layer 202 formed above a metal layer 200. The metal layer 200 may be a metal layer of an eventual metallization layer of a semiconductor structure. Although not depicted, it is to be appreciated that metal layer 200 may be formed above one of many front end and/or back end layers of a semiconductor structure. The textile structure includes a pattern of regions of a first patterned hardmask 204, a second patterned hardmask 206, a third patterned hardmask 208, and a fourth patterned hardmask 210.

Referring to part (b) of FIG. 2, the regions of the first patterned hardmask 204 are removed to form openings 212. One or more of the openings 212 is filled with first photobuckets 214, with part (b) of FIG. 2 illustrating one such photobucket.

Referring to part (c) of FIG. 2, an etch is performed through the openings 212 not filled with photobuckets 214 to etch a first pattern into the blanket hardmask layer 202 and into the metal layer 200. The photobucket 214 is then removed. The pattern is then backfilled with a hardmask material, such as the material of the first patterned hardmask 204 to provide deep hardmask regions 216 and shallow hardmask 218 of the first type.

Referring to part (d) of FIG. 2, the regions of the second patterned hardmask 206 are removed to form openings 220. One or more of the openings 220 is filled with second photobuckets 222, with part (d) of FIG. 2 illustrating three such photobuckets.

Referring to part (e) of FIG. 2, an initial etch is performed through the openings 220 not filled with photobuckets 222. The photobuckets 222 are then removed and a subsequent etch is continued to etch a second pattern into the blanket hardmask layer 202 and into the metal layer 200. The pattern is then backfilled with a hardmask material, such as the material of the second patterned hardmask 206 to provide deep hardmask regions 224 and shallow hardmask 226 of the second type.

Referring to part (f) of FIG. 2, the regions of the third patterned hardmask 208 are removed to form openings 228. One or more of the openings 228 is filled with third photobuckets 230, with part (f) of FIG. 2 illustrating one such photobucket.

Referring to part (g) of FIG. 2, an initial etch is performed through the openings 228 not filled with photobuckets 230. The photobuckets 230 are then removed and a subsequent etch is continued to etch a third pattern into the blanket hardmask layer 202 and into the metal layer 200. As described in greater detail below in association with FIGS. 3A-3T, all regions of the fourth hardmask 210 may be removed to provide openings. An etch and hardmask backfill process is performed through the openings and through the metal layer 202 to provide deep hardmask regions 234 and patterned metal layer 232, as is also depicted in part (g) of FIG. 2. It is to be appreciated that the subtractive metal etch and hardmask backfill process of the fourth hardmask 210 may be performed prior to or subsequent to the processing associated with the regions of the third patterned hardmask 208.

Referring to part (h) of FIG. 2, all remaining hardmask portions depicted in part (g) of FIG. 2 are removed. An ILD film is then formed and planarized to provide ILD layer 236 on the patterned metal layer 232. The patterned metal layer 232 includes a conductive via 240 and a conductive tab 238. The ILD layer 236 includes a plug or cut region 242.

The structure of part (h) of FIG. 2 may subsequently be used as a foundation for forming subsequent metal line/via and ILD layers. Alternatively, the structure of part (h) of FIG. 2 may represent the final metal interconnect layer in an integrated circuit. It is to be appreciated that the above process operations may be practiced in alternative sequences, not every operation need be performed and/or additional process operations may be performed. Referring again to part (h) of FIG. 2, such self-aligned fabrication by a subtractive photobucket approach may be continued to fabricate a next metallization layer. Alternatively, other approaches may be used at this stage to provide additional interconnect layers, such as conventional dual or single damascene approaches. In an embodiment, in subsequent fabrication operations, the ILD layer 236 may be removed to provide air gaps between the resulting metal lines.

In an embodiment, implementation of a processing scheme such as described above in association with FIG. 2 may include one or more of: (1) improved density since self-alignment of plugs, tabs, and/or vias can allow interconnects to be placed at higher density, (2) the need for using a metal above or metal below for perpendicular routing is eliminated, freeing up next upper or lower metallization layers for routing other signals, which also can improve density, and/or (3) self-alignment of multiple passes within the same layer can reduce the risk of shorting due to mis-alignment. Other implementations of embodiments described in the above general processing scheme are described below.

Figure 3A:
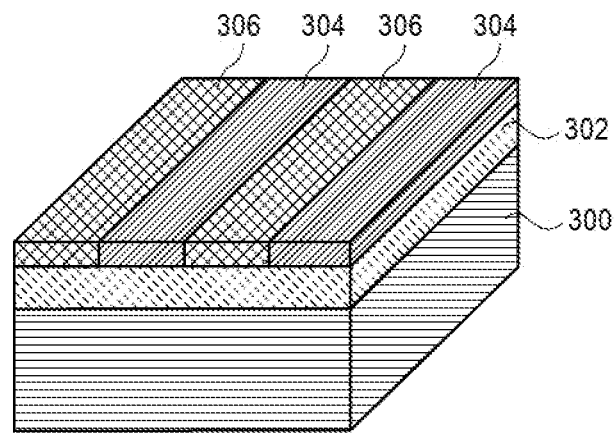
FIGS. 3A-3T illustrate angled cross-sectional views representing various operations in a method of fabricating a back end of line (BEOL) metallization layer having a conductive tab coupling metal lines of the metallization layer, in accordance with an embodiment of the present invention.
Figure 3B:
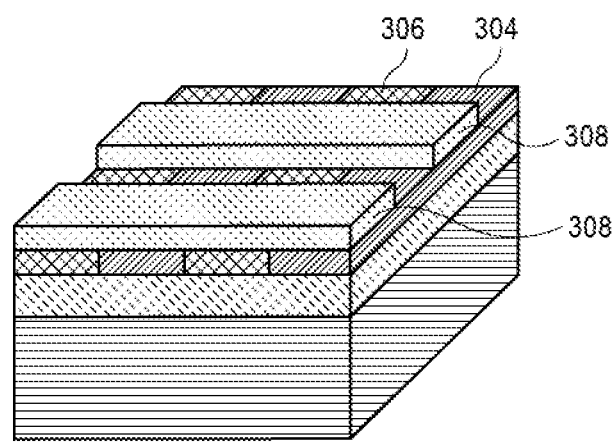
Figure 3C:
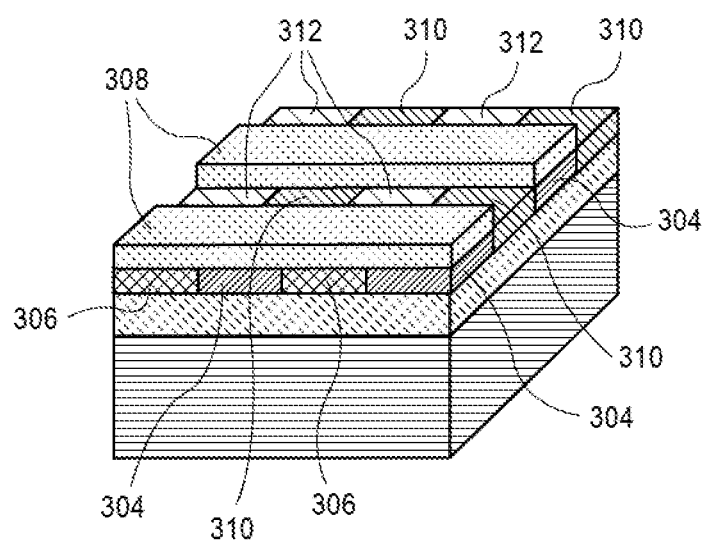
Figure 3D:
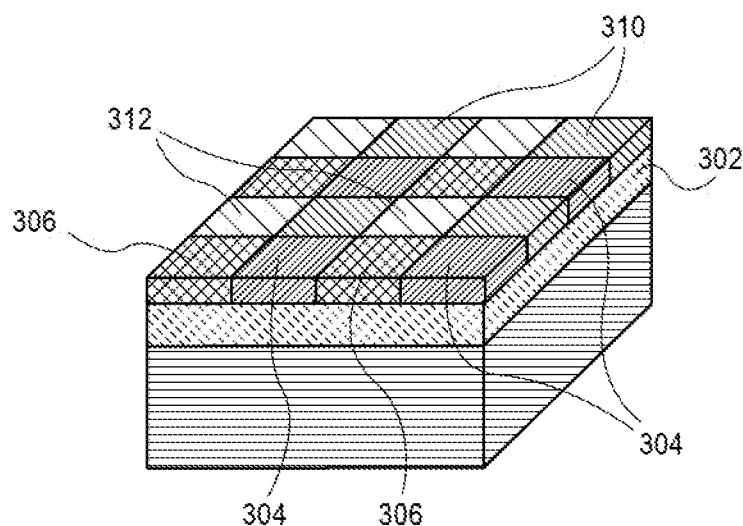
Figure 3E:
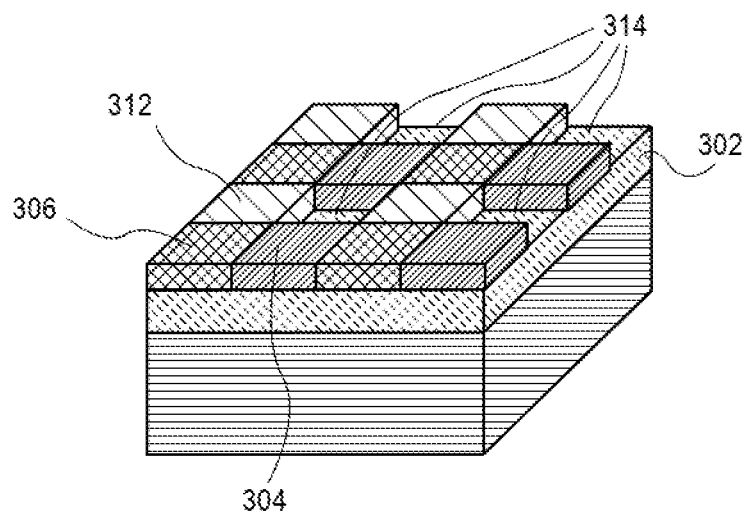
Figure 3F:
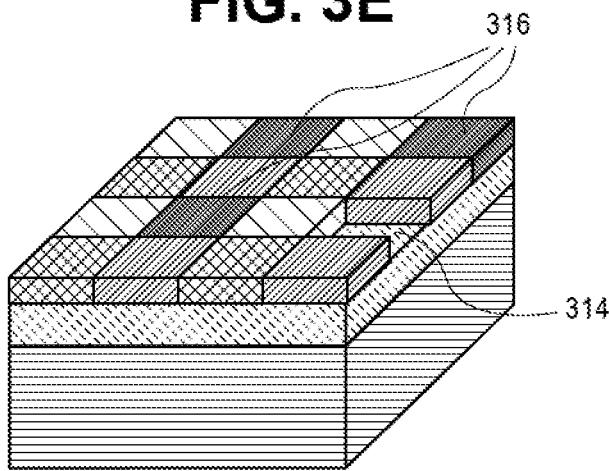
Figure 3G:
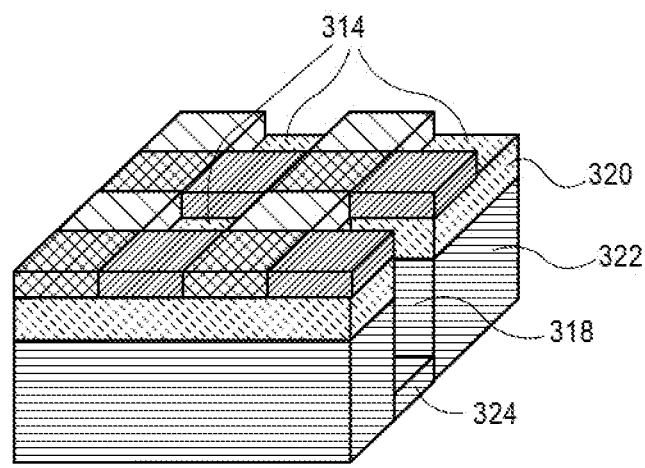
Figure 3H:
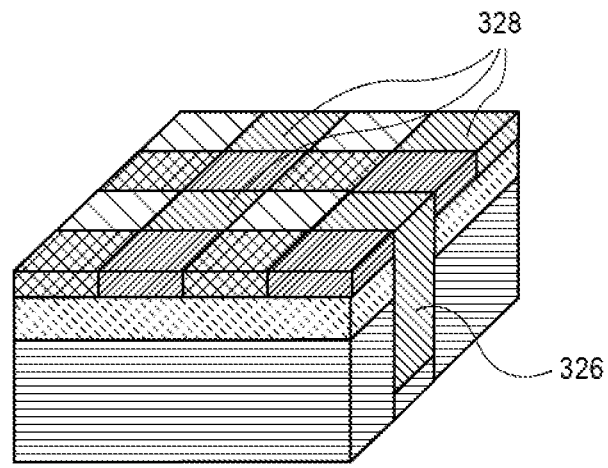
Figure 3I:
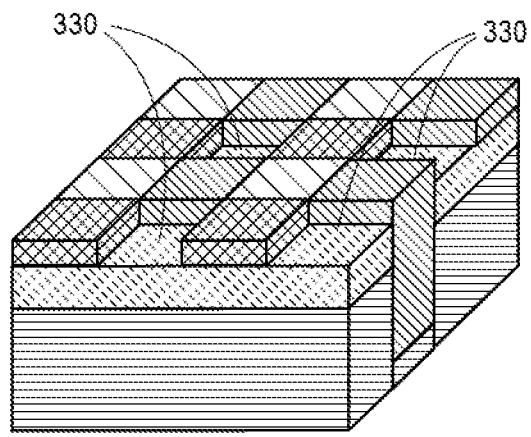
Figure 3J:
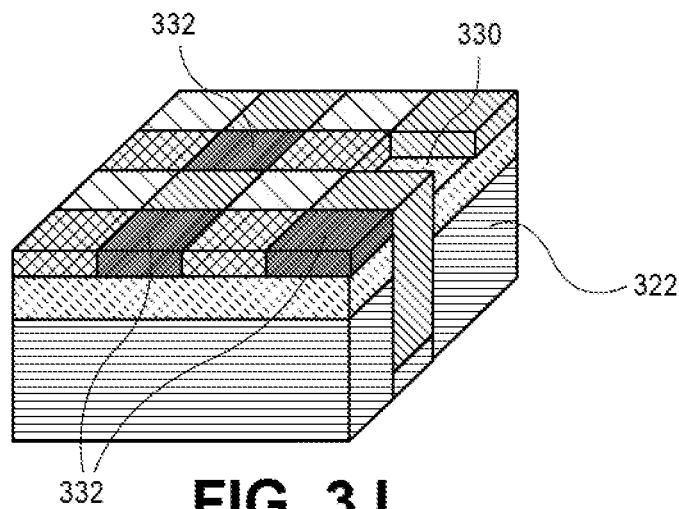
Figure 3K:
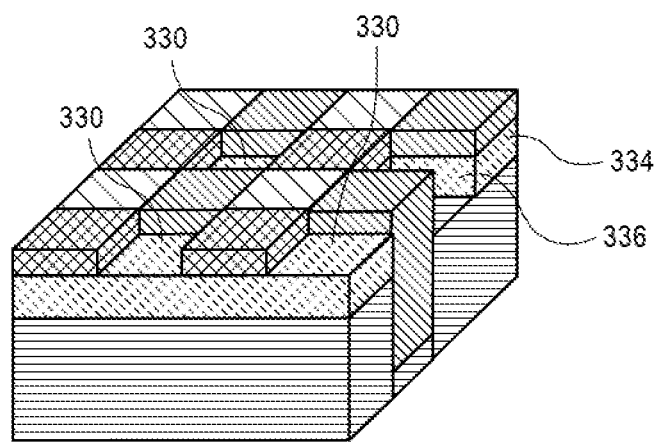
Figure 3L:
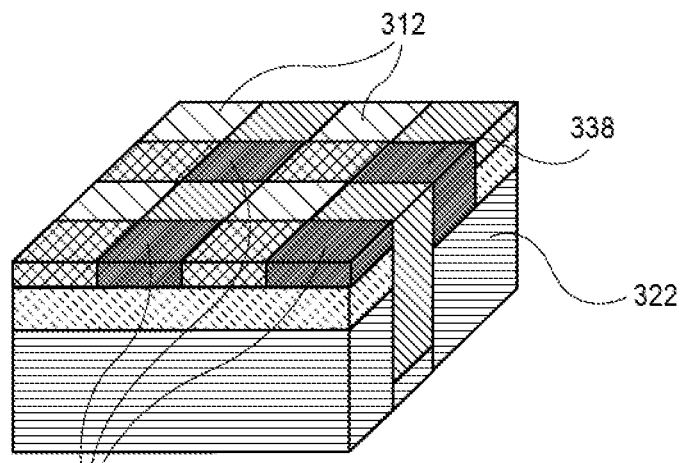
Figure 3M:
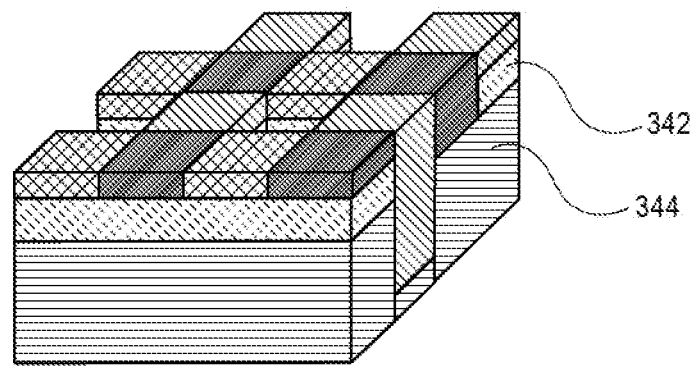
Figure 3N:
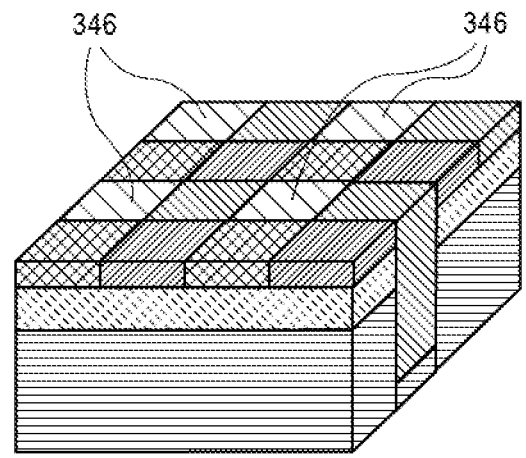
Figure 3O:
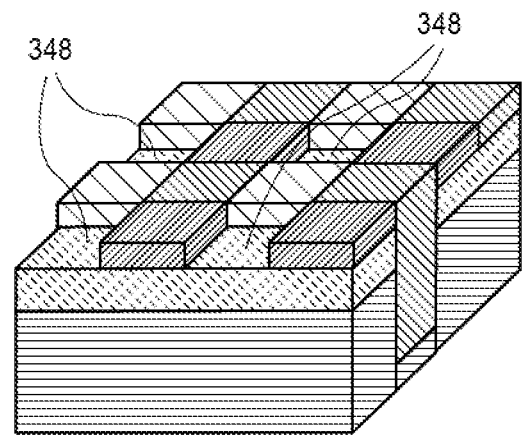
Figure 3P:
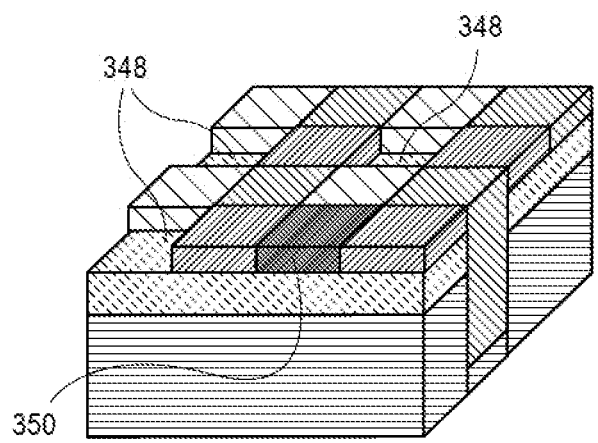
Figure 3Q:
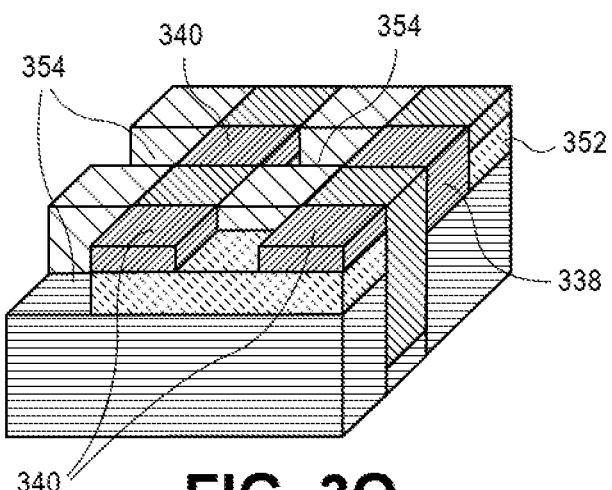
Figure 3R:
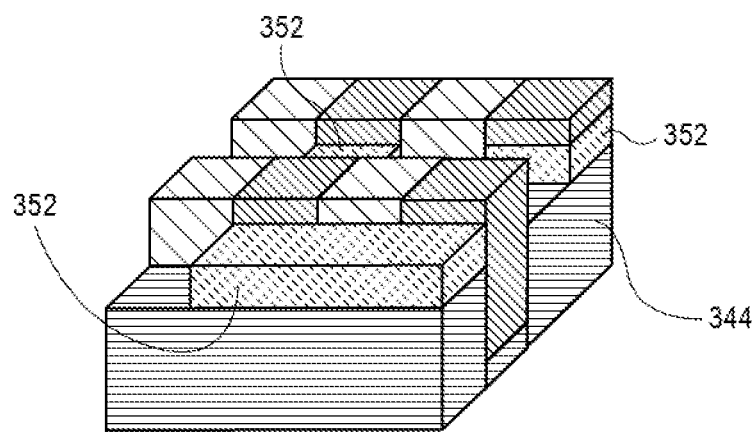
Figure 3S:
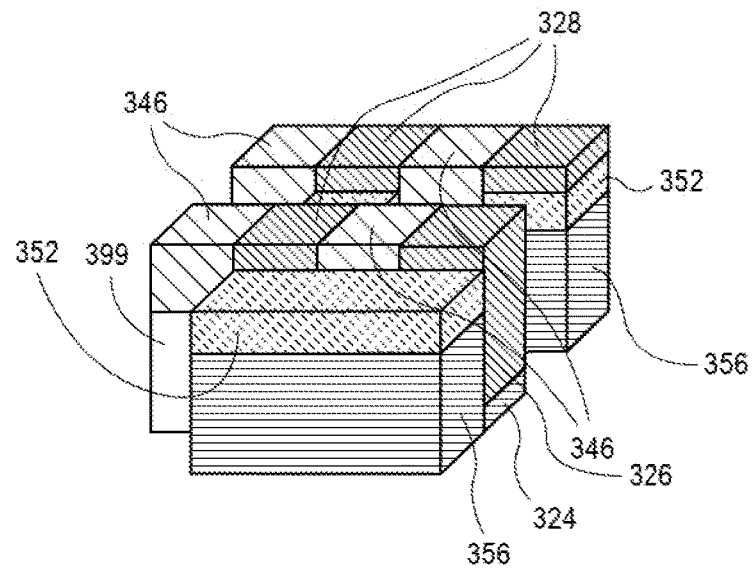
Figure 3T:
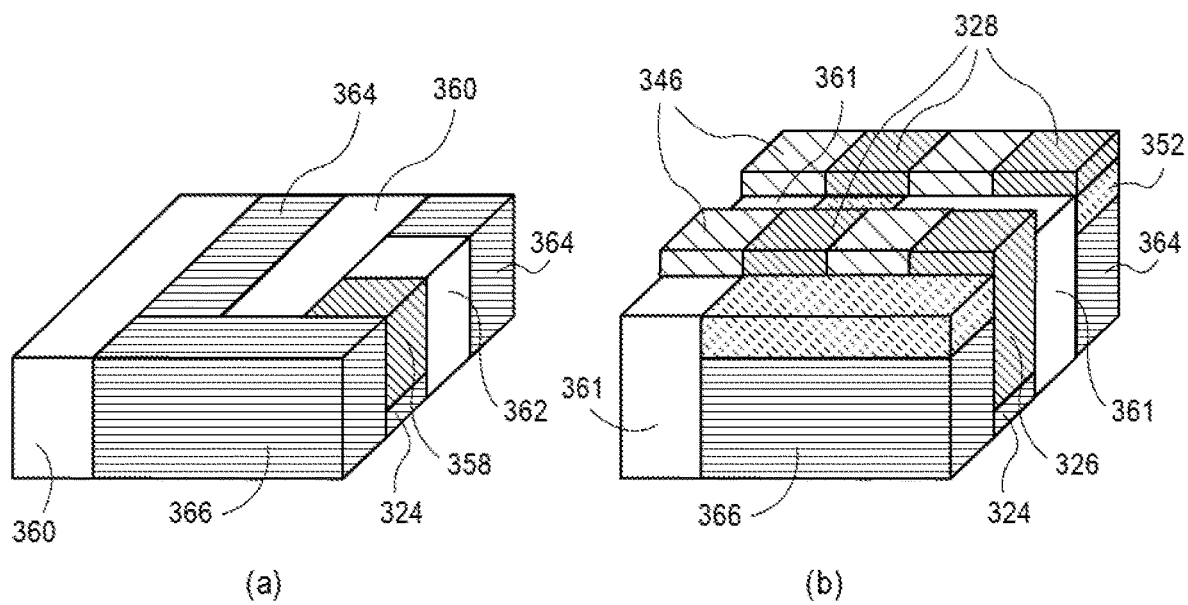

FIGS. 3A-3T illustrate angled cross-sectional views representing various operations in a method of fabricating a back end of line (BEOL) metallization layer having a conductive tab coupling metal lines of the metallization layer, in accordance with an embodiment of the present invention.

Referring to FIG. 3A, a grating patterning scheme is performed above a blanket hardmask layer 302 formed above a metal layer 300 formed above a substrate (not shown). A first grating hardmask 304 is formed along a first direction above the blanket hardmask 302. A second grating hardmask 306 is formed along the first direction and alternating with the first grating hardmask 304. In an embodiment, the first grating hardmask 304 is formed from a material having an etch selectivity different than the material of the second grating hardmask 306.

In an embodiment, the first and second grating hardmasks 304 and 306 are formed with a grating pattern, as is depicted in FIG. 3A. In an embodiment, the grating structure of the first and second grating hardmasks 304 and 306 is a tight pitch grating structure. In a specific such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the first and second grating hardmasks 304 and 306 of FIG. 3A may have hardmask lines tightly spaced at a constant pitch and having a constant width.

Referring to FIG. 3B, a sacrificial cross-grating patterning process is performed. An overlying hardmask 308 is formed with a grating pattern along a second direction, orthogonal to first direction, i.e., orthogonal to the first and second grating hardmasks 304 and 306.

In an embodiment, the overlying hardmask 308 is formed with a tight pitch grating structure. In a specific such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the overlying hardmask 308 of FIG. 3B may have hardmask lines tightly spaced at a constant pitch and having a constant width.

Referring to FIG. 3C, textile pattern formation is performed. Regions of the first hardmask 304 exposed between the grating of the overlying hardmask 308 are selectively etched and replaced with regions of a third hardmask 310. Regions of the second hardmask 306 exposed between the grating of the overlying hardmask 308 are selectively etched and replaced with regions of a fourth hardmask 312. In an embodiment, the third hardmask 310 is formed from a material having an etch selectivity different than the material of the first hardmask 304 and the second hardmask 306. In a further embodiment, the fourth hardmask 312 is formed from a material having an etch selectivity different than the material of the first hardmask 304, the second hardmask 306, and the third hardmask 310.

Referring to FIG. 3D, the overlying hardmask 308 is removed. In an embodiment, the overlying hardmask 308 is removed using an etch, ash or cleans process selective to the first hardmask 304, the second hardmask 306, the third hardmask 310, and the fourth hardmask 312 to leave a textile pattern as is illustrated in FIG. 3D.

FIGS. 3E-3H are associated with a via patterning process. Referring to FIG. 3E, the third hardmask 310 is removed selective to the first hardmask 304, selective to the second hardmask 306, and selective to the fourth hardmask 312 to provide openings 314 exposing portions of the blanket hardmask 302. In an embodiment, the third hardmask 310 is removed selective to the first hardmask 304, selective to the second hardmask 306, and selective to the fourth hardmask 312 using a selective etch or cleans process.

Referring to FIG. 3F, a via photobucket patterning scheme is performed as a first photobucketing process. In an embodiment, photobuckets are formed in all of the exposed openings 314 of FIG. 3E. Select ones of the photobuckets are removed to re-expose openings 314 while other photobuckets 316 are retained, e.g., by not exposing photobuckets 316 to a lithography and development process used to open all other of the first photobuckets (in the specific case illustrated, three photobuckets are retained while one is removed).

Referring to FIG. 3G, the exposed portion of the blanket hardmask 302 is then etched to provide first-time patterned hardmask 320. Additionally, the metal layer 300 is etched through the opening to provide an etch trench 318 in a first-time patterned metal layer 322. The first-time patterned metal layer 322 includes a conductive via 324. Subsequent to the subtractive metal etch, the remaining photobuckets 316 are removed to re-expose associated openings 314.

Referring to FIG. 3H, the trench 318 and the openings 314 are backfilled with a hardmask material. In an embodiment, a material similar to or the same as the material of the third hardmask 310 is formed on the structure of FIG. 3G and planarized or etched back to provide deep hardmask region 326 and shallow hardmask region 328. In one embodiment, deep hardmask region 326 and shallow hardmask region 328 are of the third material type (e.g., the material type of third hardmask 310).

FIGS. 3I-3L are associated with a metal line cut or plug formation patterning process. Referring to FIG. 3I, the first hardmask 304 is removed selective to the second hardmask 306, selective to the deep hardmask region 326 and shallow hardmask region 328 of the third material type, and selective to the fourth hardmask 312 to provide openings 330 exposing portions of the first-time patterned hardmask 320. In an embodiment, the first hardmask 304 is removed selective to the second hardmask 306, selective to the deep hardmask region 326 and shallow hardmask region 328 of the third material type, and selective to the fourth hardmask 312 using a selective etch or cleans process.

Referring to FIG. 3J, a cut or plug photobucket patterning scheme is performed as a second photobucketing process. In an embodiment, photobuckets are formed in all of the exposed openings 330 of FIG. 3I. Select ones of the photobuckets are removed to re-expose openings 330 while other photobuckets 332 are retained, e.g., by not exposing photobuckets 332 to a lithography and development process used to open all other of the second photobuckets (in the specific case illustrated, three photobuckets are retained while one is removed). The removed photobuckets, at this stage, represent the locations where cuts or plugs will be in a final metallization layer. That is, in the second photobucket process, photobuckets are removed from locations where plugs or cuts will ultimately be formed.

Referring to FIG. 3K, the exposed portion of the first-time patterned hardmask 320 is then etched to provide second-time patterned hardmask 334 having a trench 336 formed therein. Subsequent to the etching, the remaining photobuckets 332 are removed to re-expose associated openings 330.

Referring to FIG. 3L, the trench 334 and the openings 330 are backfilled with a hardmask material. In an embodiment, a material similar to or the same as the material of the first hardmask 304 is formed on the structure of FIG. 3K and planarized or etched back to provide deep hardmask region 338 and shallow hardmask region 340. In one embodiment, deep hardmask region 338 and shallow hardmask region 340 are of the first material type (e.g., the material type of first hardmask 304).

Referring to FIG. 3M, the fourth hardmask 312 is removed selective to the deep hardmask region 338 and shallow hardmask region 340 of the first material type, selective to the second hardmask 306, and selective to the deep hardmask region 326 and shallow hardmask region 328 of the third material type. In an embodiment, the fourth hardmask 312 is removed selective to the deep hardmask region 338 and shallow hardmask region 340 of the first material type, selective to the second hardmask 306, and selective to the deep hardmask region 326 and shallow hardmask region 328 of the third material type using a selective etch or cleans process. A deep etch process is performed through the resulting openings and entirely through the second-time patterned hardmask 334 to form third-time patterned hardmask 342, and entirely through the first-time patterned metal layer 322 to form second-time patterned metal layer 344. Although not depicted, at this stage a second cut or plug patterning process may be performed.

Referring to FIG. 3N, the deep openings formed in association with FIG. 3M are backfilled with a hardmask material. In an embodiment, a material similar to or the same as the material of the fourth hardmask 312 is formed on the structure of FIG. 3M and planarized or etched back to provide deep hardmask regions 346. In one embodiment, deep hardmask regions 346 are of the fourth material type (e.g., the material type of fourth hardmask 312). In an optional embodiment, as illustrated in association with 399 of FIG. 3S, described below, an ILD layer (such as a low-k dielectric layer) may first be filled and etch back to a level of the second-time patterned metal layer 344. The hardmask material of the fourth type (i.e., a shallow version of 346) is then formed on the ILD layer.

FIGS. 3O-3R are associated with a conductive tab formation process. Referring to FIG. 3O, the second hardmask 306 is removed selective to the deep hardmask region 338 and shallow hardmask region 340 of the first material type, selective to the deep hardmask region 326 and shallow hardmask region 328 of the third material type, and selective to the deep hardmask regions 346 of the fourth material type to provide openings 348 exposing portions of the third-time patterned hardmask 342. In an embodiment, the second hardmask 306 is removed selective to the deep hardmask region 338 and shallow hardmask region 340 of the first material type, selective to the deep hardmask region 326 and shallow hardmask region 328 of the third material type, and selective to the deep hardmask regions 346 of the fourth material type using a selective etch or cleans process.

Referring to FIG. 3P, a conductive tab photobucket patterning scheme is performed as a third photobucketing process. In an embodiment, photobuckets are formed in all of the exposed openings 348 of FIG. 3O. Select ones of the photobuckets are removed to re-expose openings 348 while other photobuckets 350 are retained, e.g., by not exposing photobuckets 350 to a lithography and development process used to open all other of the third photobuckets (in the specific case illustrated, one photobucket 350 is retained while three are removed). The removed photobuckets, at this stage, represent the locations where conductive tabs will not be formed in a final metallization layer. That is, in the third photobucket process, photobuckets 350 are retained locations where conductive tabs will ultimately be formed.

Referring to FIG. 3Q, the exposed portion of the third-time patterned hardmask 342 is then etched through openings 348 to provide fourth-time patterned hardmask 352 having trenches 354 formed therein. Subsequent to the etching, the remaining photobucket 350 is removed.

Referring to FIG. 3R, the deep hardmask region 338 and shallow hardmask region 340 of the first material type is removed selective to the deep hardmask region 326 and shallow hardmask region 328 of the third material type and selective to the deep hardmask regions 346 of the fourth material type to further expose portions of the fourth-time patterned hardmask 352. In an embodiment, the deep hardmask region 338 and shallow hardmask region 340 of the first material type is removed selective to the deep hardmask region 326 and shallow hardmask region 328 of the third material type and selective to the deep hardmask regions 346 of the fourth material type using a selective etch or cleans process.

Referring to FIG. 3S, a deep etch process is performed through the resulting openings and entirely through the second-time patterned metal layer 344 to form third-time patterned metal layer 356. At this stage, in the case that an ILD layer 399 is formed at the operation associated with FIG. 3N, as described above in an optional embodiment, portions of such an ILD layer 399 are viewable in the structure of FIG. 3S.

Referring to part (a) of FIG. 3T, in an embodiment, hardmask removal of remaining hardmask portions 328, 346, 352 of FIG. 3S is performed, and the structure is subsequently planarized. In one embodiment, the height of deep hardmask region 326 is reduced, but the region is not all together removed, to form via cap 358 and ILD 360. Additionally, a plug region 362 is formed. In one embodiment, ILD 399 is formed in association with FIG. 3N, and in one such embodiment plug region 362 includes a material different than ILD 399. In another embodiment, ILD 399 is not formed in association with FIG. 3N, and the entire portions of ILD 360 and plug 362 are formed at the same time and with a same material, e.g., using an ILD back-fill process. In an embodiment, the metallization portion of the structure includes metal lines 364, a conductive via 324 (having via cap 358 thereon), and a conductive tab 366, as is depicted in part (a) of FIG. 3T.

Referring to part (a) of FIG. 3T, in an embodiment, an ILD backfill 361 is formed on the structure of FIG. 3S. In one such embodiment, an ILD film is deposited and then etched back to provide the structure of part (b) of FIG. 3T. In an embodiment, leaving the hardmasks of FIG. 3S in place, templating of a next metallization layer may be performed. That is, the topography with the leave-behind hard masks may be used to template the next layer patterning process.

In either case, whether part (a) or (b) of FIG. 3T, embodiments described herein include a leave-behind hardmask material (358 or 326) above a conductive via 324 of a final metallization layer in a semiconductor structure. Additionally, referring again to FIG. 3A-3T, it is to be appreciated that the order for cut, via, and tab patterning may be interchangeable. Also, while the exemplary process flow shows one cut, one via, and one tab pass, multiple passes of each type of patterning may be performed.

Referring again to part (a) of FIG. 3T, in an embodiment, a back end of line (BEOL) metallization layer for a semiconductor structure includes an inter-layer dielectric (ILD) layer 360. A plurality of conductive lines 364 is disposed in the ILD layer 360 along a first direction. A conductive tab 366 couples two of the plurality of conductive lines 364 along a second direction orthogonal to the first direction.

Such an arrangement as depicted in FIG. 3T may not otherwise be achievable by conventional lithographic processing at either small pitch, small width, or both. Also, self-alignment may not be achievable with a conventional processing scheme. Furthermore, arrangements as depicted in FIG. 3T may not otherwise be achievable in cases where a pitch division scheme is used to ultimately provide a pattern for the conductive lines 364. However, in accordance with an embodiment of the present invention, the plurality of conductive lines 364 has a pitch of 20 nanometers or less. In accordance with another embodiment of the present invention, the plurality of conductive lines 364 each has a width of 10 nanometers or less. In accordance with another embodiment of the present invention, the plurality of conductive lines 364 has a pitch of 20 nanometers or less and each line has a width of 10 nanometers or less.

In an embodiment, the conductive tab 366 is continuous with the two of the plurality of conductive lines 364. In an embodiment, the conductive tab 366 is co-planar with the two of the plurality of conductive lines 366. In an embodiment, the BEOL metallization layer further includes a dielectric plug 362 disposed at an end of one of the plurality of conductive lines 366. In one embodiment, the BEOL metallization layer further includes a conductive via.

The structures of FIG. 3T may subsequently be used as a foundation for forming subsequent metal line/via and ILD layers. Alternatively, the structures of FIG. 3T may represent the final metal interconnect layer in an integrated circuit. It is to be appreciated that the above process operations may be practiced in alternative sequences, not every operation need be performed and/or additional process operations may be performed. Referring again to FIG. 3T, such self-aligned fabrication by a subtractive photobucket approach may be continued to fabricate a next metallization layer. Alternatively, other approaches may be used at this stage to provide additional interconnect layers, such as conventional dual or single damascene approaches. In an embodiment, in subsequent fabrication operations, the ILD layer 360 may be removed to provide air gaps between the resulting metal lines 364.

It is to be appreciated that approaches may be performed using fewer processing operations, however, with a trade-off of less self-alignment. In one such embodiment, tabs are fabricated using conventional patterning (e.g., carbon hard mask, silicon arc, photoresist) to etch away a section of a grating used to define metal trenches below. In one embodiment, a section of a grating used to define metal trenches below is etched away. In a specific embodiment, such an approach involves the use of photobuckets for vias and plugs but uses conventional lithography for tabs.

Figure 4:
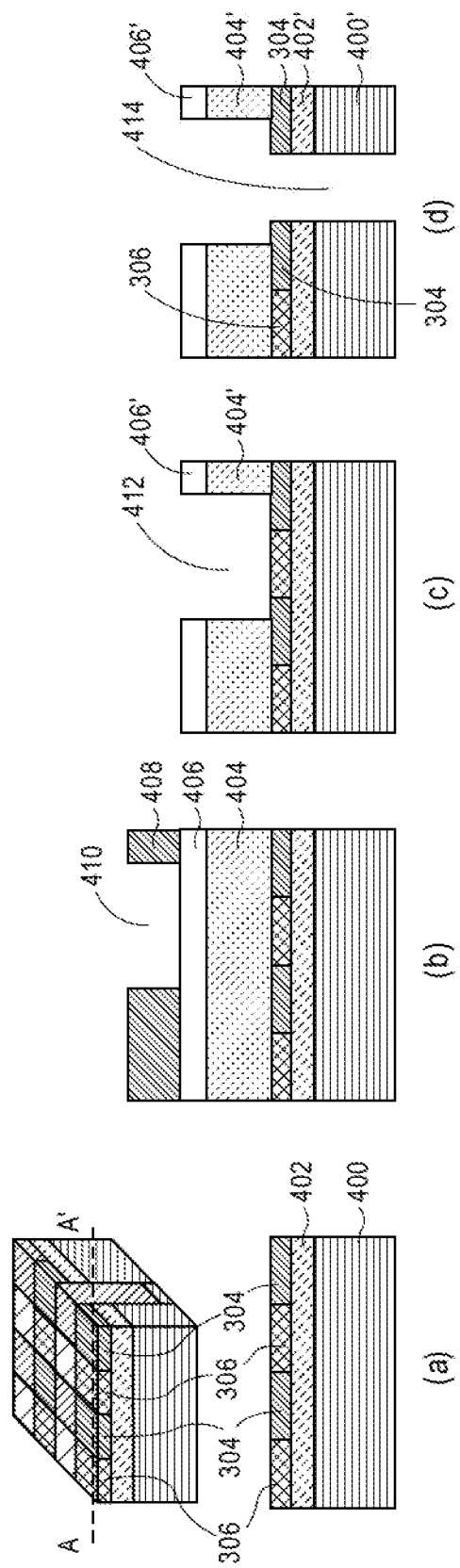
FIG. 4 illustrates angled and direct cross-sectional views representing various operations in another method of fabricating a back end of line (BEOL) metallization layer having a conductive tab coupling metal lines of the metallization layer, in accordance with an embodiment of the present invention.

As an example, FIG. 4 illustrates angled and direct cross-sectional views representing various operations in another method of fabricating a back end of line (BEOL) metallization layer having a conductive tab coupling metal lines of the metallization layer, in accordance with an embodiment of the present invention.

Referring to part (a) of FIG. 4, the structure of FIG. 3D is shown along the A-A' cross-sectional view. The hardmask layers 304 and 306 are shown above a hardmask layer 402 and a metal layer 400. Referring to part (b) of FIG. 4, a trilayer stack 404, 408 and 408 (e.g., carbon hardmask, silicon ARC, photoresist) is formed and patterned with an opening 410 above the hardmasks 304 and 306. Referring to part (c) of FIG. 4, the layers 406 and 404 are patterned to form layers 406' and 404', respectively, with an opening 412 therein. The patterned photoresist layer 408 is removed. One of the regions of hardmask 306 is then removed selectively. The exposed portions of the hardmask layer 402 and metal layer 400 are then patterned to form patterned hardmask 402' and patterned metal layer 400'. However, the opening 414 formed in the patterned hardmask 402' and patterned metal layer 400' is limited to the size of the region of hardmask 306 that was selectively removed. Thus, confined subtractive etching is enabled through hardmask selectivities.

Implementation of one or more of the above processing schemes may enable patterning interconnects at tight pitch. Some embodiments have a leave-behind hardmask material which is detectable, e.g., above a via structure. Furthermore, the above described patterning schemes can provide for structures that have self-alignment of plugs, vias, and tabs that can be difficult to achieve by a different fabrication approach.

Overall, in accordance with one or more embodiments of the present invention, approaches described herein involve use of a photobucket interlayer dielectric (ILD) to select locations for plugs, tabs, and possibly vias. The photobucket ILD composition is typically very different from standard ILD and, in one embodiment, is perfectly self-aligned in both directions. More generally, in an embodiment, the term "photobucket" as used herein involves use of an ultrafast photoresist or ebeam resist or other photosensitive material as formed in etched openings. In one such embodiment, a thermal reflow of a polymer into the openings is used following a spin coat application. In one embodiment, the fast photoresist is fabricated by removing a quencher from an existing photoresist material. In another embodiment, the photobuckets are formed by an etch-back process and/or a lithography/shrink/etch process. It is to be understood that the photobuckets need not be filled with actual photoresist, so long as the material acts as a photosensitive switch. In one embodiment, lithography is used to expose the corresponding photobuckets that are selected for removal. However, the lithographic constraints may be relaxed and misalignment tolerance may be high since the photobuckets are surrounded by non-photolyzable materials. Furthermore, in an embodiment, instead of exposing at, e.g. 30 mJ/cm$^2$, such photobuckets might be exposed at, e.g., 3 mJ/cm$^2$. Normally this would result in very poor critical dimension (CD) control and roughness. But in this case, the CD and roughness control will be defined by the photobuckets, which can be very well controlled and defined. Thus, the photobucket approach may be used to circumvent imaging/dose tradeoff which limits the throughput of next generation lithographic processes. In one embodiment, the photobuckets are subject to exposure of extreme ultraviolet (EUV) light in order to expose the photobuckets, where in a particular embodiment, EUV exposure is in the range of 5-15 nanometers.

It is to be appreciated that a photobucket process may involve placement of a photoresist in a confined structure, such as a confined structure based on a hardmask or ILD, or another material type. In one embodiment, photobucket patterning is different from conventional patterning in that it confines the edges of the photoresist in a "bucket" material.

To provide further context relevant for implementations described herein, current fabrication techniques for vias involves a "blind" process in which a via opening is patterned in a stack far above an ILD trench. The via opening pattern is then etched deep down into the trench. Overlay errors accumulate and can cause various problems, e.g., shorts to neighboring metal lines. In an example, patterning and aligning of features at less than approximately 50 nanometer pitch requires many reticles and critical alignment strategies that are otherwise extremely expensive for a semiconductor manufacturing process. In an embodiment, by contrast, approaches described herein enable fabrication of self-aligned tabs, plugs and/or vias, greatly simplifying the web of overlay errors, and leaving only one critical overlay step (Mx+1 grating). In an embodiment, then, offset due to conventional lithograph/dual damascene patterning that must otherwise be tolerated, is not a factor for the resulting structures described herein.

In an embodiment, as used throughout the present description, an interlayer dielectric (ILD) material is composed of or includes a layer of a dielectric or insulating material. Examples of suitable dielectric materials include, but are not limited to, oxides of silicon (e.g., silicon dioxide ($SiO_2$)), nitrides of silicon (e.g., silicon nitride ($Si_3N_4$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a barrier layer and a conductive fill material. In one embodiment, the barrier layer is a tantalum or tantalum nitride layer, or a combination thereof. In one embodiment, the conductive fill material is a material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, metal lines, or simply interconnect.

In an embodiment, as is also used throughout the present description, hardmask materials (and in some instances plug material layers) are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials, such as silicon carbide. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the art may be used depending upon the particular implementation. The hardmask layers may be formed by CVD, PVD, or by other deposition methods.

It is to be appreciated that the layers and materials described in association with FIG. 1B, part (h) of FIG. 2, parts (a) and (b) of FIG. 3T, and part (d) of FIG. 4 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 1B, part (h) of FIG. 2, parts (a) and (b) of FIG. 3T, and part (d) of FIG. 4 may be fabricated on underlying lower level interconnect layers formed above the substrate.

As described above, patterned features may be patterned in a grating-like pattern with lines, holes or trenches spaced at a constant pitch and having a constant width. The pattern, for example, may be fabricated by a pitch halving or pitch quartering approach. In an example, a blanket film (such as a polycrystalline silicon film) is patterned using lithography and etch processing which may involve, e.g., spacer-based-quadruple-patterning (SBQP) or pitch quartering. It is to be appreciated that a grating pattern of lines can be fabricated by numerous methods, including 193 nm immersion litho (i193), EUV and/or EBDW lithography, directed self-assembly, etc. In other embodiments, the pitch does not need to be constant, nor does the width.

Figure 5A:
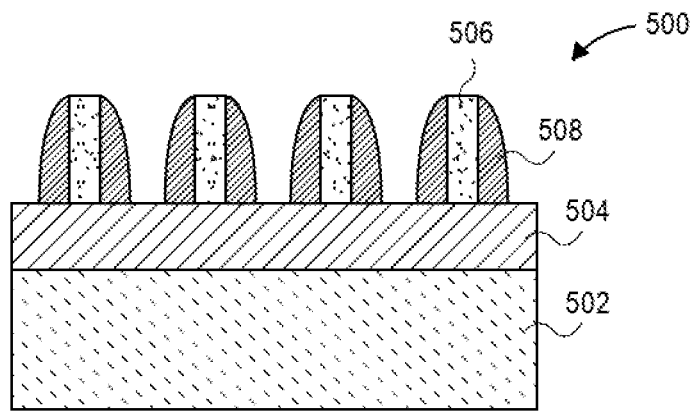
FIG. 5A illustrates a cross-sectional view of a starting structure following deposition, but prior to patterning, of a hardmask material layer formed on an interlayer dielectric (ILD) layer, in accordance with an embodiment of the present invention.
Figure 5B:
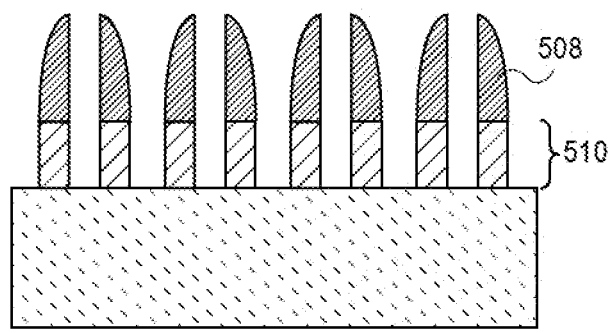
FIG. 5B illustrates a cross-sectional view of the structure of FIG. 5A following patterning of the hardmask layer by pitch halving, in accordance with an embodiment of the present invention.

In an embodiment, pitch division techniques are used to increase a line density. In a first example, pitch halving can be implemented to double the line density of a fabricated grating structure. FIG. 5A illustrates a cross-sectional view of a starting structure following deposition, but prior to patterning, of a hardmask material layer formed on an interlayer dielectric (ILD) layer. FIG. 5B illustrates a cross-sectional view of the structure of FIG. 5A following patterning of the hardmask layer by pitch halving.

Referring to FIG. 5A, a starting structure 500 has a hardmask material layer 504 formed on an interlayer dielectric (ILD) layer 502. A patterned mask 506 is disposed above the hardmask material layer 504. The patterned mask 506 has spacers 508 formed along sidewalls of features (lines) thereof, on the hardmask material layer 504.

Referring to FIG. 5B, the hardmask material layer 504 is patterned in a pitch halving approach. Specifically, the patterned mask 506 is first removed. The resulting pattern of the spacers 508 has double the density, or half the pitch or the features of the mask 506. The pattern of the spacers 508 is transferred, e.g., by an etch process, to the hardmask material layer 504 to form a patterned hardmask 510, as is depicted in FIG. 5B. In one such embodiment, the patterned hardmask 510 is formed with a grating pattern having unidirectional lines. The grating pattern of the patterned hardmask 510 may be a tight pitch grating structure. For example, the tight pitch may not be achievable directly through conventional lithography techniques. Even further, although not shown, the original pitch may be quartered by a second round of spacer mask patterning. Accordingly, the grating-like pattern of the patterned hardmask 510 of FIG. 5B may have hardmask lines spaced at a constant pitch and having a constant width relative to one another. The dimensions achieved may be far smaller than the critical dimension of the lithographic technique employed. Accordingly, a blanket film may be patterned using lithography and etch processing which may involve, e.g., spacer-based-double-patterning (SBDP) or pitch halving, or spacer-based-quadruple-patterning (SBQP) or pitch quartering.

Figure 6:
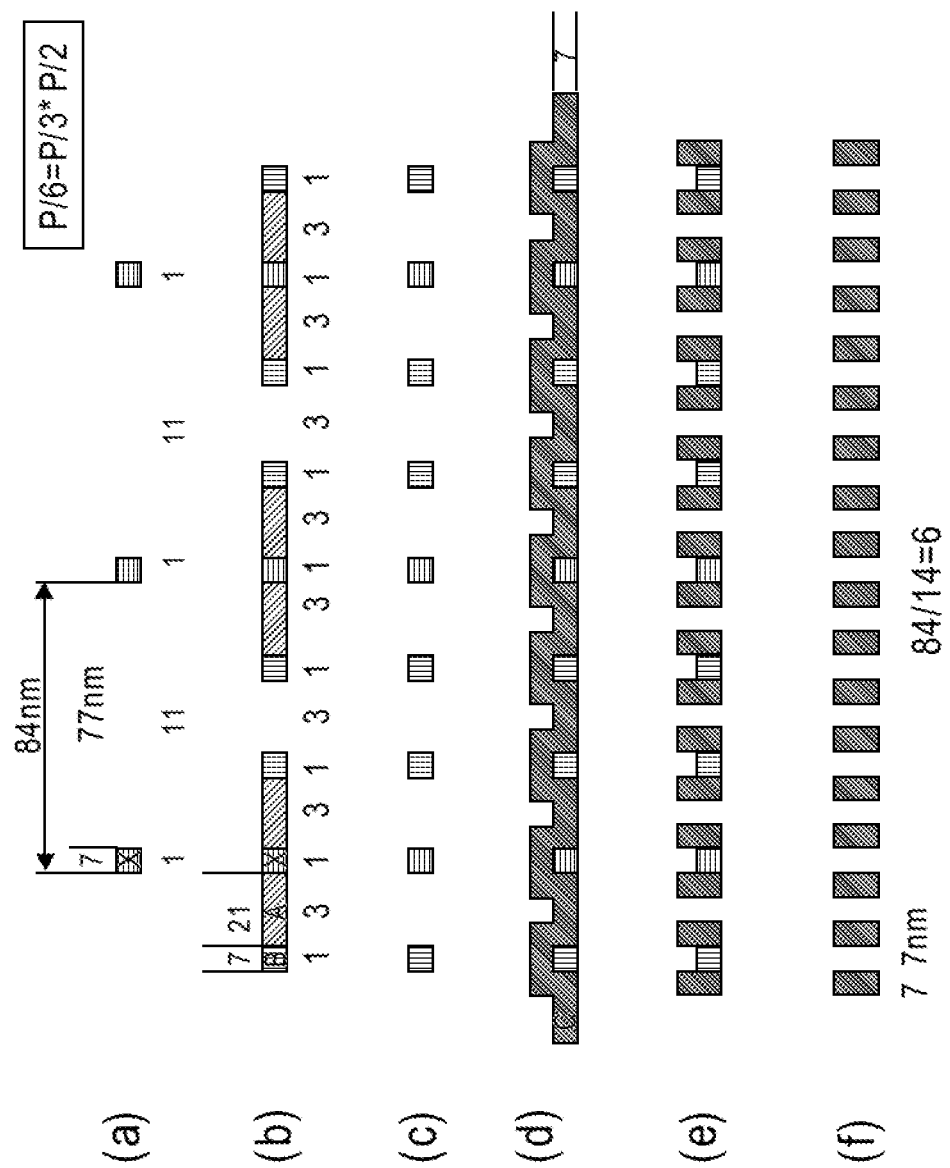
FIG. 6 illustrates cross-sectional views in a spacer-based-sextuple-patterning (SBSP) processing scheme which involves pitch division by a factor of six, in accordance with an embodiment of the present invention.

It is to be appreciated that other pitch division approaches may also be implemented. For example, FIG. 6 illustrates cross-sectional views in a spacer-based-sextuple-patterning (SBSP) processing scheme which involves pitch division by a factor of six. Referring to FIG. 6, at operation (a), a sacrificial pattern X is shown following litho, slim and etch processing. At operation (b), spacers A and B are shown following deposition and etching. At operation (c), the pattern of operation (b) is shown following spacer A removal. At operation (d), the pattern of operation (c) is shown following spacer C deposition. At operation (e), the pattern of operation (d) is shown following spacer C etch. At operation (f), a pitch/6 pattern is achieved following sacrificial pattern X removal and spacer B removal.

In an embodiment, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
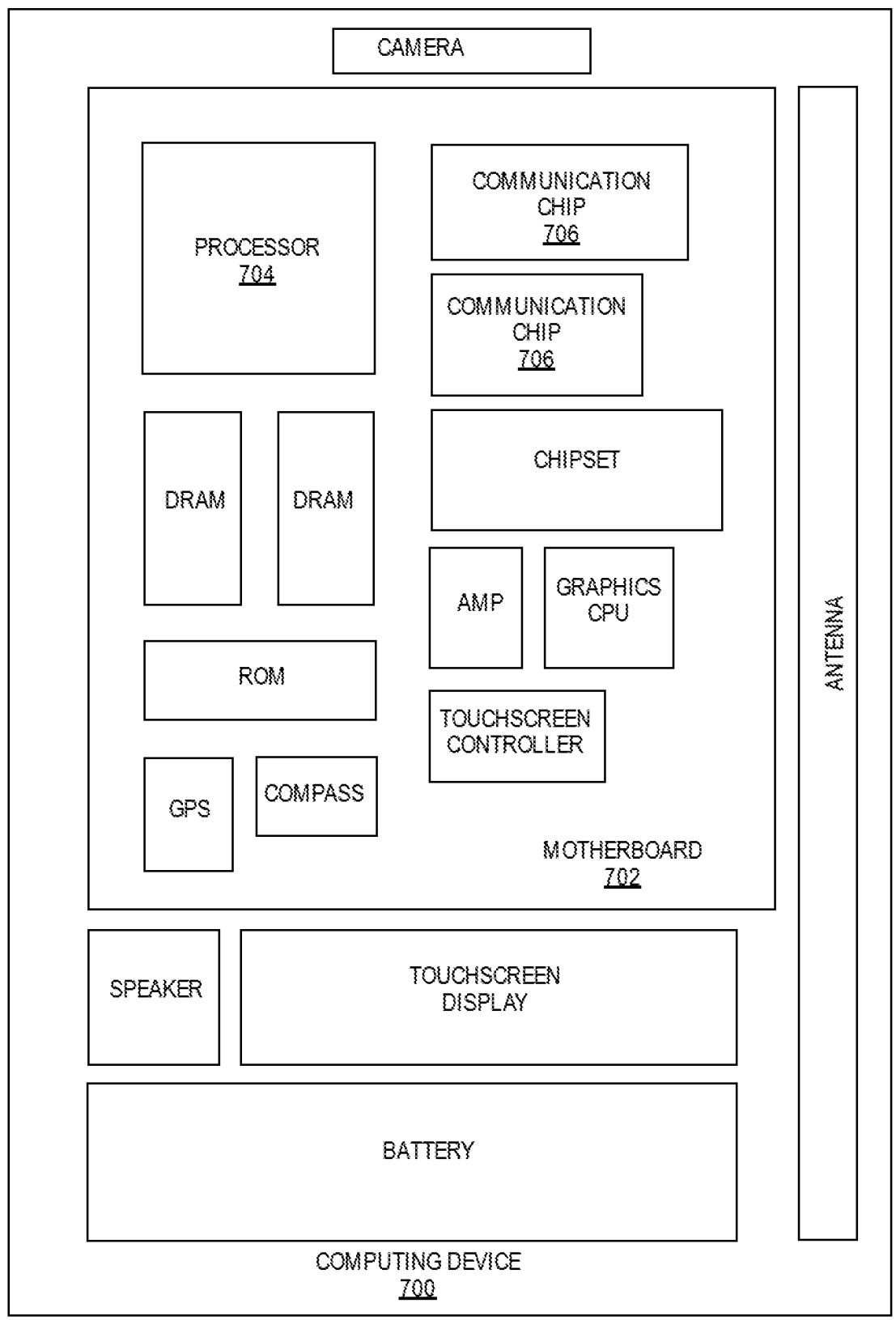
FIG. 7 illustrates a computing device in accordance with one implementation of an embodiment of the present invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of embodiments of the invention, the integrated circuit die of the processor includes one or more structures, such as BEOL metallization layers, built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of embodiments of the invention, the integrated circuit die of the communication chip includes one or more structures, such as BEOL metallization layers, built in accordance with implementations of the invention.

In further implementations, another component housed within the computing device 700 may contain an integrated circuit die that includes one or more structures, such as BEOL metallization layers, built in accordance with implementations of embodiments of the invention.

In various implementations, the computing device 700 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
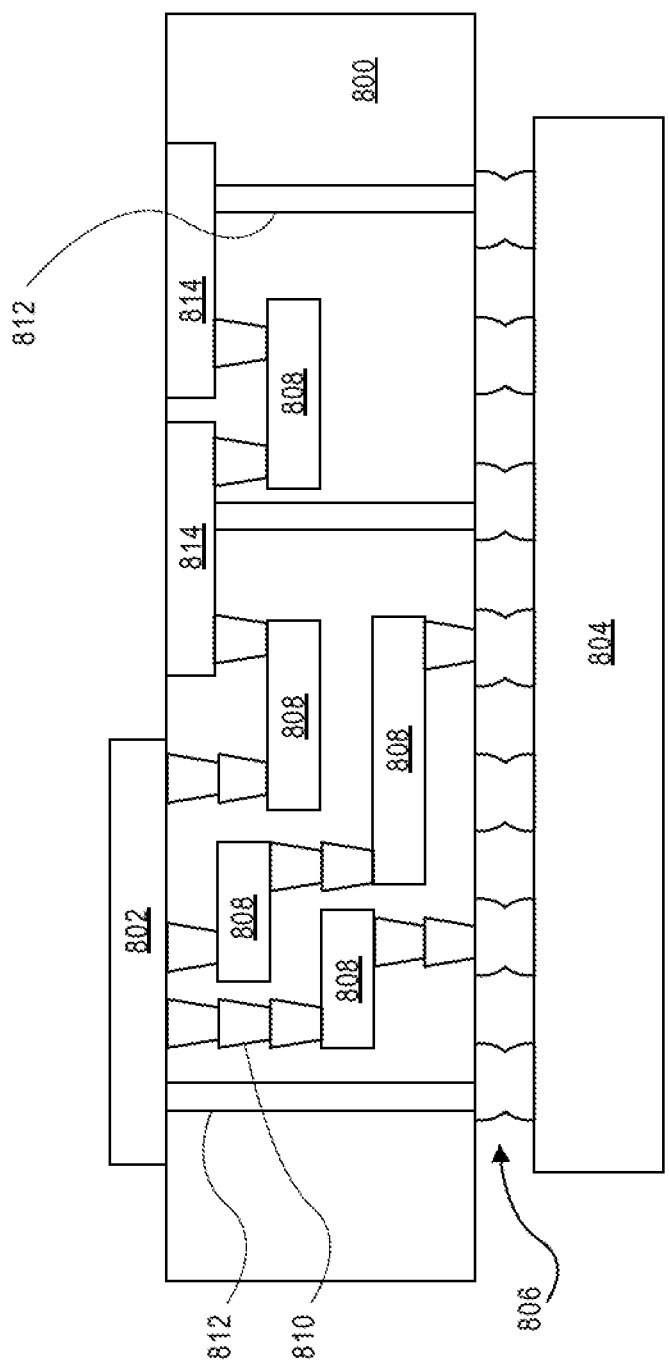
FIG. 8 is an interposer implementing one or more embodiments of the invention.

FIG. 8 illustrates an interposer 800 that includes one or more embodiments of the invention. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer 800 may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the invention, apparatuses or processes disclosed herein may be used in the fabrication of interposer 800.

Thus, embodiments of the present invention include subtractive plug and tab patterning with photobuckets for back end of line (BEOL) spacer-based interconnects.

In an embodiment, a back end of line (BEOL) metallization layer for a semiconductor structure includes an inter-layer dielectric (ILD) layer disposed above a substrate. A plurality of conductive lines is disposed in the ILD layer along a first direction. A conductive tab is disposed in the ILD layer, the conductive tab coupling two of the plurality of conductive lines along a second direction orthogonal to the first direction. A conductive via is coupled to one of the plurality of conductive lines, the conductive via having a via hardmask thereon. An uppermost surface of each of the ILD layer, the plurality of conductive lines, the conductive tab, and the via hardmask is planar with one another.

In one embodiment, the BEOL metallization layer further includes a dielectric plug disposed adjacent the conductive via and breaking continuity of one of the plurality of conductive lines, the dielectric plug having an uppermost surface planar with the uppermost surface of the via hardmask.

In one embodiment, the dielectric plug is composed of a material different than the ILD layer.

In one embodiment, the dielectric plug is composed of a same material as the ILD layer and is continuous with the ILD layer.

In one embodiment, the conductive tab is continuous with the two of the plurality of conductive lines.

In one embodiment, the plurality of conductive lines has a pitch of 20 nanometers or less.

In one embodiment, each of the plurality of conductive lines has a width of 10 nanometers or less.

In an embodiment, a back end of line (BEOL) metallization layer for a semiconductor structure includes an inter-layer dielectric (ILD) layer disposed above a substrate. A plurality of conductive lines is disposed in the ILD layer along a first direction. A conductive tab is disposed in the ILD layer, the conductive tab coupling two of the plurality of conductive lines along a second direction orthogonal to the first direction. A dielectric plug breaks continuity of one of the plurality of conductive lines. An uppermost surface of each of the ILD layer, the plurality of conductive lines, the conductive tab, and the dielectric plug is planar with one another.

In one embodiment, the dielectric plug is composed of a material different than the ILD layer.

In one embodiment, the dielectric plug is composed of a same material as the ILD layer and is continuous with the ILD layer.

In one embodiment, the conductive tab is continuous with the two of the plurality of conductive lines.

In one embodiment, the plurality of conductive lines has a pitch of 20 nanometers or less.

In one embodiment, each of the plurality of conductive lines has a width of 10 nanometers or less.

In an embodiment, a method of fabricating a back end of line (BEOL) metallization layer for a semiconductor structure includes forming a metal layer above a substrate. The method also includes performing a first photobucket process to form one or more conductive vias in the metal layer. The method also includes performing a second photobucket process to form one or more cut locations in the metal layer. The method also includes performing a third photobucket process to form one or more conductive tabs in the metal layer. The method also includes subtractively etching a plurality of metal lines in the metal layer, the plurality of metal lines coupled to the one or more conductive vias, coupled to the one or more conductive tabs, and having a continuity broken by the one or more cut locations.

In one embodiment, the method further includes forming an inter-layer dielectric (ILD) layer between the plurality of metal lines.

In one embodiment, the method further includes forming dielectric plugs in the one or more cut locations.

In one embodiment, forming the dielectric plugs includes forming a same dielectric material as the ILD layer.

In one embodiment, the dielectric plugs are continuous with the ILD layer.

In one embodiment, forming the dielectric plugs includes forming a different dielectric material the ILD layer.

In one embodiment, the first photobucket process is performed prior to the second photobucket process, and the second photobucket process is performed prior to the third photobucket process.

In one embodiment, the second photobucket process is performed prior to the first photobucket process, and the first photobucket process is performed prior to the third photobucket process.

In one embodiment, the third photobucket process is performed prior to the second photobucket process, and the second photobucket process is performed prior to the first photobucket process.

In one embodiment, the third photobucket process is performed prior to the first photobucket process, and the first photobucket process is performed prior to the second photobucket process.

What is claimed is:

1. A method of fabricating a back end of line (BEOL) metallization layer for a semiconductor structure, the method comprising:
    forming a metal layer above a substrate;
    performing a first photobucket process to form one or more conductive vias in the metal layer;
    performing a second photobucket process to form one or more cut locations in the metal layer;
    performing a third photobucket process to form one or more conductive tabs in the metal layer; and
    subtractively etching a plurality of metal lines in the metal layer, the plurality of metal lines coupled to the one or more conductive vias, coupled to the one or more conductive tabs, and having a continuity broken by the one or more cut locations.

2. The method of claim 1, further comprising forming an inter-layer dielectric (ILD) layer between the plurality of metal lines.

3. The method of claim 2, further comprising forming dielectric plugs in the one or more cut locations.

4. The method of claim 3, wherein forming the dielectric plugs comprises forming a same dielectric material as the ILD layer.

5. The method of claim 4, wherein the dielectric plugs are continuous with the ILD layer.

6. The method of claim 3, wherein forming the dielectric plugs comprises forming a different dielectric material the ILD layer.

7. The method of claim 1, wherein the first photobucket process is performed prior to the second photobucket process, and the second photobucket process is performed prior to the third photobucket process.

8. The method of claim 1, wherein the second photobucket process is performed prior to the first photobucket process, and the first photobucket process is performed prior to the third photobucket process.

9. The method of claim 1, wherein the third photobucket process is performed prior to the second photobucket process, and the second photobucket process is performed prior to the first photobucket process.

10. The method of claim 1, wherein the third photobucket process is performed prior to the first photobucket process, and the first photobucket process is performed prior to the second photobucket process.

11. A method of fabricating a back end of line (BEOL) metallization layer for a semiconductor structure, the method comprising:
forming an inter-layer dielectric (ILD) layer disposed above a substrate;
forming a plurality of conductive lines disposed in the ILD layer along a first direction;
forming a conductive tab disposed in the ILD layer, the conductive tab coupling two of the plurality of conductive lines along a second direction orthogonal to the first direction; and
forming a conductive via coupled to one of the plurality of conductive lines, the conductive via having a via hardmask thereon, wherein an uppermost surface of each of the ILD layer, the plurality of conductive lines, the conductive tab, and the via hardmask is planar with one another.

12. The method of claim 11, further comprising:
forming a dielectric plug disposed adjacent the conductive via and breaking continuity of one of the plurality of conductive lines, the dielectric plug having an uppermost surface planar with the uppermost surface of the via hardmask.

13. The method of claim 12, wherein the dielectric plug is composed of a material different than the ILD layer.

14. The method of claim 12, wherein the dielectric plug is composed of a same material as the ILD layer and is continuous with the ILD layer.

15. The method of claim 11, wherein the conductive tab is continuous with the two of the plurality of conductive lines.

16. The method of claim 11, wherein the plurality of conductive lines has a pitch of 20 nanometers or less.

17. The method of claim 11, wherein each of the plurality of conductive lines has a width of 10 nanometers or less.

18. A method of fabricating a back end of line (BEOL) metallization layer for a semiconductor structure, the method comprising:
forming an inter-layer dielectric (ILD) layer disposed above a substrate;
forming a plurality of conductive lines disposed in the ILD layer along a first direction;
forming a conductive tab disposed in the ILD layer, the conductive tab coupling two of the plurality of conductive lines along a second direction orthogonal to the first direction; and
forming a dielectric plug breaking continuity of one of the plurality of conductive lines, wherein an uppermost surface of each of the ILD layer, the plurality of conductive lines, the conductive tab, and the dielectric plug is planar with one another, and wherein the dielectric plug is composed of a material different than the ILD layer.

19. The method of claim 18, wherein the conductive tab is continuous with the two of the plurality of conductive lines.

20. The method of claim 18, wherein the plurality of conductive lines has a pitch of 20 nanometers or less.

21. The method of claim 18, wherein each of the plurality of conductive lines has a width of 10 nanometers or less.

22. A method of fabricating a computing device, the method comprising:
providing a board; and
coupling a component to the board, the component including an integrated circuit structure, the integrated circuit comprising a back end of line (BEOL) metallization layer for a semiconductor structure, the BEOL metallization layer comprising:
an inter-layer dielectric (ILD) layer disposed above a substrate;
a plurality of conductive lines disposed in the ILD layer along a first direction; and
a conductive tab disposed in the ILD layer, the conductive tab coupling two of the plurality of conductive lines along a second direction orthogonal to the first direction; and
a conductive via coupled to one of the plurality of conductive lines, the conductive via having a via hardmask thereon, wherein an uppermost surface of each of the ILD layer, the plurality of conductive lines, the conductive tab, and the via hardmask is planar with one another.

23. The method of claim 22, further comprising:
coupling a memory coupled to the board.

24. The method of claim 22, further comprising:
coupling a communication chip coupled to the board.

25. The method of claim 22, further comprising:
coupling a camera coupled to the board.

* * * * *